United States Patent
Watanabe et al.

(10) Patent No.: US 7,998,324 B2
(45) Date of Patent: Aug. 16, 2011

(54) SPUTTERING TARGET AND PROCESS FOR PRODUCING SI OXIDE FILM THEREWITH

(75) Inventors: Koichi Watanabe, Yokohama (JP); Yukinobu Suzuki, Kanagawa-ken (JP); Takashi Ishigami, Yokohama (JP)

(73) Assignees: Kabushiki Kaisha Toshiba, Tokyo (JP); Toshiba Materials Co., Ltd., Yokohama-shi (JP)

( * ) Notice: Subject to any disclaimer, the term of this patent is extended or adjusted under 35 U.S.C. 154(b) by 1400 days.

(21) Appl. No.: 10/573,406

(22) PCT Filed: Sep. 22, 2004

(86) PCT No.: PCT/JP2004/013833
§ 371 (c)(1), (2), (4) Date: Mar. 27, 2006

(87) PCT Pub. No.: WO2005/031028
PCT Pub. Date: Apr. 7, 2005

(65) Prior Publication Data
US 2008/0245656 A1 Oct. 9, 2008

(30) Foreign Application Priority Data
Sep. 26, 2003 (JP) .................... 2003-334899

(51) Int. Cl.
*C23C 14/14* (2006.01)
(52) U.S. Cl. .................. 204/298.13; 204/192.23
(58) Field of Classification Search ........... 204/298.13
See application file for complete search history.

(56) References Cited

U.S. PATENT DOCUMENTS

| | | | |
|---|---|---|---|
| 4,416,755 A * | 11/1983 | Ceasar et al. | 204/192.11 |
| 5,952,086 A | 9/1999 | Ohnishi et al. | |
| 6,193,856 B1 | 2/2001 | Kida et al. | |
| 6,197,134 B1 * | 3/2001 | Kanzaki et al. | 148/682 |
| 6,334,938 B2 | 1/2002 | Kida et al. | |
| 6,440,278 B1 | 8/2002 | Kida et al. | |
| 6,743,343 B2 | 6/2004 | Kida et al. | |
| 6,800,182 B2 * | 10/2004 | Mitsui et al. | 204/298.13 |
| 2002/0171123 A1 * | 11/2002 | Voutsas et al. | 257/622 |

FOREIGN PATENT DOCUMENTS

| | | |
|---|---|---|
| DE | 696 33 631 | 11/2004 |
| EP | 0 757 116 A1 | 2/1997 |
| EP | 0 852 266 A1 | 7/1998 |
| EP | 1 452 622 A2 | 9/2004 |
| JP | 63-145771 A | 6/1988 |
| JP | 02-122072 A | 5/1990 |
| JP | 05-229812 A | 9/1993 |
| JP | 06-220625 A | 8/1994 |
| JP | 07-026371 A | 1/1995 |
| JP | 08-311643 A | 11/1996 |
| JP | 09-104972 A | 4/1997 |
| JP | 10-195611 A | 7/1998 |
| JP | 11-171596 A | 6/1999 |
| JP | 2000-026957 A | 1/2000 |
| JP | 2002-173765 A | 6/2002 |
| JP | 2002-275625 A | 9/2002 |
| JP | 2002-338354 A | 11/2002 |
| JP | 2003-171760 A | 6/2003 |
| WO | WO 97/08359 A1 | 3/1997 |

* cited by examiner

Primary Examiner — Keith D Hendricks
Assistant Examiner — Jason M Berman
(74) Attorney, Agent, or Firm — Foley & Lardner LLP

(57) ABSTRACT

A Si sputtering target that in the measurement of crystal face orientation of sputtering surface according to X-ray diffractometry, exhibits a ratio of peak intensity of (111) face ($I_{(111)}$) to peak intensity of (220) face ($I_{(220)}$) of Si, ($I_{(111)}/I_{(220)}$), falling within the range of 1.8±0.3. The Si sputtering target comprises, for example, an Si sintered material of 70 to 95% relative density. With respect to sputtering films such as Si oxide film, the film thickness characteristics, film formation cost, etc. can be improved by the use of this Si sputtering target.

7 Claims, No Drawings

SPUTTERING TARGET AND PROCESS FOR PRODUCING SI OXIDE FILM THEREWITH

TECHNICAL FIELD

The present invention relates to a sputtering target which is used for formation of an Si oxide film for an optical thin film and the like and a process for producing an Si oxide film therewith.

BACKGROUND ART

Conventionally, devices using a cathode ray tube (CRT) have been used extensively as display units. The CRT requires an installation space of a prescribed size or more, so that the liquid crystal display is rapidly wide spreading as a light and thin display unit. The liquid crystal display is being used for displays of mobile phones, PDAs and the like; monitors for personal computers; home televisions and other various types of home appliances. And, the plasma display panel (PDP) has been put to practical use as a self-luminous type display device. A display unit using an electron emission element such as a field emission type cold cathode, namely a field emission type display (FED), is also being put into practical use.

The above-described display devices are first required to be easily readable as a matter of course. Therefore, it is necessary to suppress surface reflection on the screen in order to prevent a background, which degrades a contrast, from reflecting on the screen. Accordingly, the surface of the display device is generally treated for antireflection. An antireflection film is formed by alternately stacking thin films having high and low different refractive indexes according to an optical design, thereby causing interference of the reflected lights to attenuate the reflectance. As a method of forming such an antireflection film, a vapor deposition method or a sol-gel method has been mainly adopted, but a sputtering method is began to be adopted in view of production capacity and controllability of film thickness lately.

For component materials of the antireflection film, an oxide film of Ta, Nb, Ti, Zr, Hf or the like is mainly used as a high refractive index film, and an oxide film of Si is mainly used as a low refractive index film (e.g., Patent Documents 1 through 3). Known methods of forming an Si oxide film include (1) a method of performing reactive sputter by using an Si target in a mixture gas atmosphere of Ar and $O_2$, (2) a method of performing plasma oxidation of an Si film which is formed by using an Si target, and (3) a method of performing sputter film formation by using a $SiO_x$ target. It is general to use the film forming methods (1) and (2), and a monocrystalline or polycrystalline Si target which is produced by a melting method is used.

Incidentally, a refractive index is particularly important for an optical thin film such as a thin film for an antireflection film. In addition, the display devices adopting the antireflection film and also the fields of portable phones, automobiles, building materials and the like require mass production, so that thin films having the same levels of refractive index are required to be formed efficiently and stably. Here, the refractive index of the thin film highly depends on its thickness, so that the stability of the film thickness must be enhanced in a step of forming the thin film for an antireflection film by the sputtering method. Especially, it is important that the thickness of the thin film is prevented from varying until about the end of the life of the sputtering target.

In a step of forming an Si oxide film by using a conventional Si target, a film-forming speed is controlled in order to control the thickness of a thin film. But, when an Si target formed of a conventional melting material is used, there is a tendency that the film-forming speed decreases as the life end comes closer. The film thickness distribution in the surface is varied with a change in the film-forming speed. The refractive index of the thin film highly depends on its thickness, so that the uniformity of a reflection preventing effect is deteriorated if the in-plane distribution of the thickness is varied. Thus, the Si oxide film, which is formed by using the conventional Si target, causes degradation of the characteristics, nonuniformization or the like of the antireflection film.

Besides, the Si target formed of a conventional melting material has a problem that the Si oxide film has a low film forming speed. The film forming speed has a direct effect on the Si oxide film and on the production cost of the antireflection film. The Si target formed of the conventional melting material also has a problem that it is easily cracked in a stage of a low frequency of use, e.g., a stage in that an erosion depth has not reached ¼ of the thickness of the Si target. Thus, the slow film forming speed and the early crack of the Si target are causes of increasing the film forming cost of the Si oxide film and a defect occurrence rate.

Patent Document 1: Pamphlet of (PCT) International Publication No. WO 97/08359

Patent Document 2: Japanese Patent Laid-Open Application No. HEI 11-171596 A1

Patent Document 3: Japanese Patent Laid-Open Application No. 2002-338354 A1

SUMMARY OF THE INVENTION

The present invention may improves the film thickness characteristics and the like of the Si oxide film and provides a sputtering target that enables to decrease the film forming cost and the defect occurrence rate. The present invention may decreases the film forming cost and the defect occurrence rate by using the sputtering target and provides a process of producing an Si oxide film that enables to uniformize the film thickness distribution, the film characteristics and the like.

A first sputtering target of the present invention is a sputtering target consisting essentially of Si, wherein a ratio $(I_{(111)}/I_{(220)})$ of peak intensity $(I_{(111)})$ of (111) face to peak intensity $(I_{(220)})$ of (220) face of Si is in a range of 1.8±0.3 when a sputtering surface of the target is measured for crystal face orientation by X-ray diffractometry.

A second sputtering target of the present invention is a sputtering target consisting essentially of Si, wherein the target has hardness in a range of Hv 300 or more and Hv 800 or less in terms of Vickers hardness.

A third sputtering target of the present invention is a sputtering target consisting essentially of Si, wherein the target comprises an Si sintered material having a relative density in a range of 70% or more and 95% or less.

A fourth sputtering target of the present invention is a sputtering target consisting essentially of Si, wherein an oxygen content of the target is in a range of 0.01 mass % or more and 1 mass % or less.

A process for producing an Si oxide film of the present invention comprises forming an Si oxide film by sputtering the sputtering target of the present invention in an oxygen-containing atmosphere.

BEST MODE FOR IMPLEMENTING THE INVENTION

Embodiments of carrying out the present invention will be described below. The sputtering target according to an embodiment of the present invention is substantially formed of Si. The sputtering target (Si target) of this embodiment is used to form, for example, an optical thin film having a reflection preventing function, a wavelength isolation function, a wavelength-synthesizing function and the like or an Si oxide film ($SiO_2$ film or the like) which is suitable as its component film. As an optical thin film having a reflection preventing function, there is a multilayered film which has a high refractive index film and a low refractive index film alternately stacked according to an optical design. In the component films of the antireflection film, the Si oxide film is used as a low refractive index film.

In such a sputtering target (Si target), the sputtering surface has a crystal orientation ratio of Si controlled as follows. Specifically, where the sputtering surface is measured for the crystal face orientation by X-ray diffractometry, the crystal orientation ratio of the sputtering surface is controlled so that a ratio ($I_{(111)}/I_{(220)}$) of peak intensity ($I_{(111)}$) of (111) face to peak intensity ($I_{(220)}$) of (220) face of Si falls in a range of 1.8±0.3. Here, the (111) face and the (220) face of Si are crystal planes, which indicate a high peak intensity, in the crystal face orientation of Si described in a JCPDS card. For example, the monocrystalline Si is generally established a (111) orientation.

The fact that the peak intensity ratio ($I_{(111)}/I_{(220)}$) of (111) face and (220) face of Si is in a range of 1.8±0.3 indicates that the crystal face orientation of the sputtering surface is substantially in a non-orientation state (a random state) as described in detail below. According to the crystal orientation control (making at random) of Si of the sputtering surface, it becomes possible to decrease dispersions in thickness within the surface of the film formed by sputtering. It is also possible to reduce the dispersion in the film forming speed at the time of forming the film by sputtering and also the thickness dispersion which depends on the film forming speed.

In other words, it is general that the Si target of the conventional melting material is oriented in the (111) face regardless of whether it is a monocrystalline material or a polycrystalline material. In such a case, the peak intensity ratio ($I_{(111)}/I_{(220)}$) of the (111) face to the (220) face becomes about 5.5±1.2. Sintered materials are also used as various types of sputtering targets. But, it is general to use a high density material having a relative density of 99% or more, namely a sintered material having a density close to that of a melting material. In a case where a high density sintered material is applied to the Si target, the (111) orientation property degrades in comparison with the case that the melting material is used, but the peak intensity ratio ($I_{(111)}/I_{(220)}$) becomes about 4.5±1.2.

It has been confirmed that dispersion tends to cause an in-plane distribution of the thickness in a case where an Si target having a high orientation property with respect to a particular crystal plane (e.g., (111) face) is used to perform sputter film formation. In other words, an ejection angle of sputter particles is different depending on the crystal plane. Therefore, when the Si target having a high orientation property to a particular crystal plane is used, the sputter particles have a particular flight angle (flight direction). Therefore, a deposited degree of the sputter particles is variable depending on a position within the surface of the film formed by sputtering. Besides, when the film formation is continued by using the Si target which is oriented on a particular surface, the erosion portion is ground with inclination, so that the sputter particles gradually become dispersing in a large area. Such a situation becomes a cause of lowering the film forming speed.

What are described above are considered to be causes of a dispersion in thickness within the film surface of the sputtering film and a dispersion in the film thickness with time. For example, where an Si target formed of a conventional melting material is used, an in-plane distribution of the thickness is about 5%. And, even when an Si target which is formed of a high-density sintered material is used, the in-plane distribution of the thickness becomes about 4%. Therefore, to decrease the in-plane distribution of the thickness or the dispersion with time, it is important that the sputtering surface of the Si target should not be oriented on a particular surface, in other words, it is important that a setting texture is not formed. Thus, biasing of a flight direction (flight angle) of the sputter particles to a particular direction can be improved. Besides, it becomes possible to suppress the increase of the flight angle of the sputter particles with time.

Accordingly, the sputtering target (Si target) of this embodiment controls the peak intensity ratio ($I_{(111)}/I_{(220)}$) of these crystal planes to a range of 1.8±0.3 with reference to the peak intensity of (111) face and the peak intensity of (220) face at the crystal orientation ratio of the sputtering surface. Here, in the X-ray diffraction result (according to a JCPDS card) of Si powder indicating a non-orientation state of Si, the peak intensity ratio ($I_{(111)}/I_{(220)}$) of the (111) face and the (220) face is 1.8, and a sputtering surface closer to a non-orientation state can be realized by approximating to the above state.

According to the Si target that the peak intensity ratio ($I_{(111)}/I_{(220)}$) of the sputtering surface is in a range of 1.8±0.3 (1.5 to 2.1), the flight angle (flight direction) of the sputter particles becomes a state closer to a random state, and the in-plane distribution of the thickness of the sputtering film and the dispersion with time can be decreased. For example, it becomes possible to realize a sputtering film (Si oxide film or the like) having the in-plane distribution of the thickness of 1% or less. If the peak intensity ratio ($I_{(111)}/I_{(220)}$) is less than 1.5 or exceeds 2.1, the flight direction of the sputter particles is biased or the flight angle of the sputter particles increases with time, so that the in-plane distribution of the thickness of the sputtering film or the dispersion with time increases. The peak intensity ratio ($I_{(111)}/I_{(220)}$) of the sputtering surface is preferably in a range of 1.8±0.2, and more preferably in a range of 1.8±0.1.

The peak intensity ratio ($I_{(111)}/I_{(220)}$) of the sputtering surface indicates a ratio of peak intensities obtained by determining the peak intensity of (111) face and that of (220) face from the X-ray diffraction pattern of the sputtering surface. The peak intensity ratio is determined as follows. For example, where the target is disk, individual test pieces are collected from a total of 17 portions which include the center of the target (1 portion), individual positions (a total of 8 portions) at a distance of 50% from the center on four straight lines which pass through the center of the target and equally divide the periphery, and individual positions (a total of eight portions) at a distance of 90% from the center. Peak intensity ratios are determined from the X-ray diffraction patterns of these 17 test pieces. The average value of these peak intensity ratios is determined as the peak intensity ratio ($I_{(111)}/I_{(220)}$) of the present invention.

X-ray diffraction of each test piece is conducted by an XRD device (RAD-B manufactured by RIGAKU) on the surface of the test piece by polishing the surface of the test piece starting from #120 and finishing the surface by #4000. Specifically, the X-ray diffraction is conducted under the measurement conditions of, for example, X-ray: Cu-κα, a measurement angle: 30 to 110°, tube voltage: 50V, tube current: 100 A, a scan speed: 5°/min, a scan step: 0.05°, a divergence slit: 1 deg, a scattering slit: 1 deg, a light-receiving slit: 0.15 mm, a scan mode: continuous, a scan axis: 2θ/θ, offset: 0°, a fixed angle of 0°, and a goniometer: a two-axis vertical goniometer.

In order to realize the sputtering surface having the above-described peak intensity ratio ($I_{(111)}/I_{(220)}$), it is desirable that the sputtering target is formed of an Si sintered material having a relative density in a range of 70 to 95%. When the Si sintered material, which forms the Si target, is formed to be in a high density state having a relative density of exceeding 95%, it tends to orient to a particular crystal plane during the process. Meanwhile, if the Si sintered material has a relative density of less than 70%, the sintered material has insufficient strength and tends to have a crack, a chipped portion or the like when it is fabricated into a target shape. Thus, the production cost of the Si target increases.

The above sputtering target formed of the Si sintered material having a relative density in a range of 70 to 95% also contributes to improvement of a film forming speed at the time of sputtering. Specifically, when the Si target has a relatively low relative density, an apparent surface area of the surface of the target increases, and the area to be sputtered by Ar ions or the like becomes large. As a result, the film forming speed at the time of sputtering can be increased. Especially, trapping of oxygen by the Si target is considered to be a cause of decreasing the film forming speed, so that the film forming speed of the Si oxide film can be increased more effectively by increasing the area to be sputtered.

If the Si target has a relative density of exceeding 95%, a sufficient effect of improving the film forming speed can not be obtained by increasing the sputtering area. The Si target of the conventional melting material has a relative density of about 100% in either of a monocrystalline material and a polycrystalline material, and it is considered to be a cause of a delay of the film forming speed. A sintered material is applied as various types of sputtering targets. In such a case, it is general that a high-density material having a relative density of, for example, 99% or more, namely a sintered material having a density similar to that of the melting material, is used. Therefore, it is considered that the film forming speed is lowered when the sputtering target formed of the conventional sintered material is used because the target is formed to have a high density similar to the melting material target.

Meanwhile, if the Si target has a relative density of less than 70%, strength becomes insufficient, particles, dust and the like are produced in a large amount, and there is a possibility that the quality of the Si oxide film is degraded. It is more desirable that the Si target has a relative density in a range of 80 to 95%. By using the Si target having the above relative density, the film forming speed is improved, and a high quality Si oxide film can be produced with high reproducibility. It is more desirable that the Si target has a relative density of 90% or more, so that the characteristics such as thickness, quality and the like of the Si oxide film can be improved.

It is desirable for the relative density of the Si target that a film forming speed of the target as a whole is uniformly increased, and dispersion of the relative density of the target as a whole is suppressed low to improve the uniformity and the like of the film thickness distribution of the sputtering film (e.g., Si oxide film). Specifically, it is preferable that the dispersion of the relative density of the Si target as a whole is within 30%. The use of the Si target not having a large dispersion in the relative density makes it possible to uniformly increase the film forming speed of the target as a whole. It contributes to the improvement of the uniformity of the film thickness distribution in the film surface of the sputtering film (e.g., Si oxide film). It is more desirable that the dispersion in the relative density of the Si target as a whole is within 10%.

The relative density of the Si target and its dispersion indicate the values determined as follows. For example, where the Si target is disk, test pieces are collected from the individual portions (a total of 17 portions) of the target in the same way as the measurement of the peak intensity ratio. These 17 test pieces are measured for the relative density, and the average value of the measured values is determined as the relative density of the Si target. It is assumed that the dispersion in the relative density is determined based on a formula [{(maximum value−minimum value)/(maximum value+minimum value)}×100(%)] according to the maximum value and minimum value of the relative densities (individual measured values) of individual test pieces. It should be noted that the relative density of each test piece is measured according to an Archimedes method.

The sputtering target formed of the above-described Si sintered material has appropriate hardness. Specifically, the Si target having Vickers hardness in a range of Hv 300 to 800 can be realized. By virtue of the above hardness, a crack or the like of the Si target in a stage of a low frequency of use can be prevented. If the Si target has Vickers hardness exceeding Hv 800, a thermal stress cannot be eased within the target, and a crack or the like is caused in a stage of a low frequency of use (e.g., a stage that an erosion depth to the thickness of the Si target is less than ¼). Meanwhile, if the Si target has Vickers hardness of less than Hv 300, a crack, a chipped portion or the like tends to occur at a time of fabricating into the target shape, for example.

Hardness of the sputtering target formed of the Si sintered material is more desirably in a range of Hv 400 to 600 in terms of Vickers hardness. Besides, it is also significant that the uniformity of the hardness of the sputtering target is improved, so that it is desirable that the dispersion of the hardness (Vickers hardness) of the target as a whole is within 30%. If the dispersion of the Vickers hardness is large, a thermal stress within the Si target tends to become no uniform, and a crack or the like tends to occur in the target. It is desirable that the dispersion in the Vickers hardness of the Si target as a whole is within 10%.

The Si target having the above-described hardness can be obtained by using an Si sintered material as a target material and controlling its density into a suitable range. In a case where the Si sintered material is produced, the purity and particle diameter of the Si powder as the material powder, and the conditions for sintering the Si powder, specifically, a sintering method, a sintering temperature, a sintering time, a sintering pressure and the like are appropriately selected or determined. Thus, the control of the production conditions of the Si sintered material allows controlling the Si sintered material and, therefore, the hardness of the Si target using it can be controlled to a desired value.

The hardness (Vickers hardness) and its dispersion of the Si target indicate the values determined as follows. For example, where the target is disk, test pieces are collected from 17 portions in the same way as the above-described peak intensity ratio. These 17 test pieces are measured for Vickers hardness, and the average value of the measured values is determined as the Vickers hardness of the target. Dispersion in the Vickers hardness is determined based on a formula [{(maximum value−minimum value)/(maximum value+minimum value)}×100(%)] according to the maximum value and minimum value of Vickers hardness (individual measured values) of the test pieces. The Vickers hardness of each test piece is measured by mirror polishing (e.g., polishing to

1000 and buffing) the surface of each test piece and applying a load of 200 g (load applying time of 10 sec) to the mirror finished surface by a hardness tester for Vickers indentation (HMV200 manufactured by SHIMADZU).

The sputtering target (Si target) of this embodiment desirably contains oxygen in a range of 0.01 to 1 mass %. The use of the Si target containing such an amount of oxygen reduces an amount of oxygen in the sputtering atmosphere to be trapped into the Si target at the time of forming the Si oxide film. Therefore, oxygen plasma ions which contribute to the reactive sputter increase. Accordingly, the film forming speed at the time of conducting the sputter film formation, particularly the film forming speed of the Si oxide film, can be improved.

Specifically, if the Si target has an oxygen content of less than 0.01 mass %, oxygen contained in the sputtering atmosphere is trapped by the Si target at the time of forming the film. Thus, the oxygen plasma ions contributing to the reactive sputter decrease. Especially, the film forming speed at the time of forming the Si oxide film lowers. The Si target of the conventional melting material has a low oxygen content, and it is also considered to be a cause of lowering the film forming speed. Meanwhile, if the Si target has an oxygen content of exceeding 1 mass %, the Si target has high specific resistance, and abnormal electrical discharge or the like tends to occur at the time of conducting, for example, DC sputtering. Even if the sputter film formation is possible, there is a high possibility of the quality degradation or the like of the Si oxide film. It is more preferable that the Si target has an oxygen content in a range of 0.1 to 0.5 mass %.

For the oxygen content of the Si target, it is desirable that the dispersion in the oxygen content of the target as a whole is suppressed to low in order to uniformly increase the film forming speed of the target as a whole and also to improve the uniformity of film thickness distribution of the sputtering film (e.g., Si oxide film). Specifically, it is desirable that the dispersion of the oxygen content of the Si target as a whole is suppressed within 30%. The use of the Si target not having large dispersion in the oxygen content enables to increase more uniformly the film forming speed of the target as a whole. And, it contributes to the improvement of the uniformity of the film thickness distribution in the surface of the sputtering film (e.g., Si oxide film). It is more desirable that the dispersion in the oxygen content of the Si target as a whole is within 10%.

The oxygen content and its dispersion of the Si target indicate the values determined as follows. For example, where the target is disk, test pieces are collected from individual portions (a total of 17 portions) of the target in the same way as the measurement of the peak intensity ratio. These 17 test pieces are measured for the oxygen content, and the average value of the measured values is determined as the oxygen content of the Si target. Dispersion in the oxygen content is determined based on a formula [{(maximum value−minimum value)/(maximum value+minimum value)}×100(%)] according to the maximum value and minimum value of the oxygen contents (individual measured values) of the test pieces. The oxygen content of each test piece is measured by an inert gas fusion infrared-ray absorption method.

The Si target having the above-described oxygen content can be obtained by using the Si sintered material as the target material. In a case where the Si sintered material is to be produced, the purity and particle diameter of the Si powder as the material powder, and the conditions of sintering the Si powder, specifically, a sintering method, a sintering temperature, a sintering time, a sintering pressure and the like are appropriately selected or determined. Thus, the Si sintered material and the oxygen content in the Si target using it can be controlled to a desired value. Besides, to control the oxygen content to a desired range, it is also desirable to perform heat treatment (calcining) in an atmosphere containing an appropriate amount of oxygen before the sintering is performed at a sintering temperature.

For the Si material forming the sputtering target, it is desirable to use, for example, an Si material having a purity of 99% or more in view of the usage for an antireflection film (low refractive index film) and the like. The purity here indicates a value obtained by subtracting a total amount of impurity elements other than Si, for example, individual contents (mass %) of the elements such as Fe, Ni, Cr, Al, Cu, Na, K from 100%. It is desirable that the content of the impurity elements is 1 mass % or less, namely the purity of Si is 99% or more. Besides, it is more desirable that the impurity element content in the Si target is 0.5 mass % or less, namely the purity of Si is 99.5% or more.

From a practical viewpoint, it is desirable to use the Si material having an impurity element content in a range of 0.01 to 1 mass % (Si purity of 99 to 99.99%) in the target. The reason of naming the impurities Fe, Ni, Cr, Al, Cu, Na and K is that these elements are unavoidably contained in the Si material powder and during the production process or have an adverse effect if contained in the antireflection film. In other words, the impurities other than those named above can be neglected practically because their amounts contained in the raw material or during the process are very little. And, as a measuring method, a known method such as ICP analysis method or the like is used.

The sputtering target (Si target) of the above-described embodiment can be obtained as follows. Specifically, Si powder having the above-described purity is charged into a mold (e.g., carbon mold) corresponding to a desired target shape. It is desirable that the particle diameter of the Si powder is suitably selected according to the configuration of the Si target. For example, to obtain the sputtering surface in a non-orientation state, it is desirable to use Si powder which is obtained by mixing, for example, fine powder having a particle diameter of 150 μm or less and coarse powder having a particle diameter of 300 μm or more at a mass ratio in a range of 70:30 to 80:20 (=Si fine powder: Si coarse powder). The use of the above mixture Si powder enables to suppress the orientation at the time of sintering.

To obtain an Si target of which relative density and Vickers hardness are controlled, it is desirable to use Si powder having an average particle diameter of 200 μm or less, further Si powder having an average particle diameter of 100 μm or less. It is desirable that the Si powder has a particle diameter in a range of 75 to 100 μm. The same condition is applied when an oxygen content is controlled. Besides, in order to decrease the dispersion in the relative density, it is also effective to enhance the charging density and its uniformity by applying vibrations or the like after charging the Si powder into the mold. Si powder containing an appropriate amount of oxygen may be used to control the oxygen content of the Si target and its dispersion.

The Si powder charged into the mold is raised to a sintering temperature and sintered under pressure by, for example, a hot press (HP) or an HIP. Normal-pressure sintering, atmospheric pressure sintering or the like may be used depending on the conditions. Where the Si powder is sintered by the hot press or the HIP, it is desirable to heat in a state that a pressure of about 10 MPa is applied previously in order to control the orientation of the sputtering surface. It is because the direction possessed by the Si powder is prevented from being changed.

It is also effective to perform a heat treatment (calcining) in an atmosphere containing an appropriate amount of oxygen before the sintering at the sintering temperature in order to control the oxygen content to a desired range. It is desirable to conduct the heat treating step in order to contain oxygen under conditions of, for example, a temperature of 500° C. for approximately 1 to 5 hours. A degassing process is effective for improvement of Vickers hardness. To improve the Vickers hardness and to control the oxygen content at the same time, it is desirable that an appropriate amount of oxygen is introduced into the heat treatment atmosphere in the second half stage of the heat treatment for degassing.

The Si powder is sintered at a temperature in a range of 800 to 1300° C., and it is desirable to perform at a temperature in a range of 800 to 1100° C. It is also desirable that the sintering temperature is kept for two hours or more. Then, the applied pressure is removed, and cooling to room temperature is conducted. It is desirable that a cooling speed is 30° C./min or less to have the sputtering surface in a non-orientation state. By controlling the cooling speed after sintering to 30° C./min or less, the crystal orientation (particular crystal orientation) produced at the time of the pressure sintering is eased so that a random state can be obtained with higher reproducibility.

The target material (Si sintered material) produced by applying the above-described sintering step is machined into a desired shape, and it is bonded to a backing plate which is formed of, for example, Al or Cu, thereby enabling to obtain a sputtering target (Si target). To bond to the backing plate, commonly used diffusion bonding or solder bonding is applied. Where the solder bonding is applied, bonding to the backing plate is made with a known In-based or Sn-based bonding material intervened between them. And, the diffusion bonding is preferably conducted at a temperature of 600° C. or less.

The sputtering target (Si target) of this embodiment is suitably used for forming the Si oxide film ($SiO_x$ film) which is applied to an optical thin film such as an antireflection film as described above. The $SiO_x$ film is obtained by performing reactive sputter of the Si target in, for example, a mixture gas of Ar and $O_2$. The $SiO_x$ film can also be formed by performing the sputter film formation of the Si film by using the Si target and conducting its plasma oxidation processing.

When the $SiO_x$ film is to be formed, in-plane dispersion in the thickness and dispersion with time can be reduced by using the Si target of this embodiment, so that a high-quality $SiO_x$ film can be obtained with high reproducibility. It highly contributes to improvement of the quality of the optical thin film such as an antireflection film. Besides, the increase of the frequency of use of the Si target and the improvement of the film forming speed of the $SiO_x$ film can be made. Thus, it becomes possible to improve the productivity and quality of the optical thin film such as an antireflection film.

Specific examples of the invention and their evaluated results will be described below.

EXAMPLES 1 TO 3

First, boron-doped Si powder having a purity of 3N was prepared. The Si powder was classified into fine powder having a particle diameter of 150 μm or less and coarse powder having a particle diameter of 300 μm or more. The Si fine powder and the Si coarse powder were mixed at a mass ratio of 70:30 (Example 1), 75:25 (Example 2), and 80:20 (Example 3) (by a ball mill for two hours). Each of the individual Si powders was charged in a carbon mold, which was then placed in a hot press (HP) machine. A pressure of 10 MPa was applied starting from the initial state, and sintering was performed in an Ar gas atmosphere at 800° C. (Example 1), 900° C. (Example 2), and 1000° C. (Example 3) for three hours. Then, the pressure was released, and the temperature was cooled to room temperature at a velocity of 10° C./min.

The individual target materials (Si sintered materials) obtained as described above had a relative density (measured by Archimedes method) of 75% in Example 1, 86% in Example 2, and 93% in Example 3, respectively. The target materials each were machined into a shape having a diameter of 300 mm and a thickness of 5 mm and brazed to a Cu backing plate to produce three types of Si sputtering targets. The X-ray diffraction of the sputtering surfaces of these Si targets was performed according to the above-described method to find that the peak intensity ratio ($I_{(111)}/I_{(220)}$) of (111) face and (220) face of Si of the sputtering surface was 1.5 in Example 1, 1.8 in Example, and 2.1 in Example 3. These Si targets were subjected to the characteristic evaluation described later.

EXAMPLES 4 TO 6

Boron-doped Si powder having a purity of 3N was prepared and classified into fine powder having a particle diameter of 150 μm or less and coarse powder having a particle diameter of 300 μm or more. The Si fine powder and the Si coarse powder were mixed at a mass ratio of 70:30 (by a ball mill for two hours). The Si powder was charged into a capsule and vacuum-sealed, then the capsule was set in a HIP apparatus. Pressures 80 MPa (Example 1), 100 MPa (Example 2) and 120 MPa (Example 3) were applied from the initial state, and HIP treatment (sintering) was performed under conditions of 700° C.×3 hr (Example 1), 800° C.×5 hr (Example 2), and 900° C.×2.5 hr (Example 3) in an Ar atmosphere. Then, the pressure was released, and the temperature was cooled to room temperature at a velocity of 20° C./min.

The individual target materials (Si sintered materials) obtained as described above had a relative density of 78% in Example 4, 88% in Example 5, and 94% in Example 6, respectively. The target materials were machined into a shape having a diameter of 300 mm and a thickness of 5 mm and brazed to a Cu backing plate to produce three types of Si sputtering targets. The X-ray diffraction of the sputtering surfaces of these Si targets was performed according to the above-described method to find that the peak intensity ratio ($I_{(111)}/I_{(220)}$) of (111) face and (220) face of Si of the sputtering surface was 1.55 in Example 4, 1.82 in Example 2, and 2.05 in Example 3. These Si targets were subjected to the characteristic evaluation described later.

COMPARATIVE EXAMPLES 1 TO 3

Boron-doped Si powders having a purity of 3N and a particle diameter of 150 μm or less (Comparative Example 1), a particle diameter of 150 to 300 μm (Comparative Example 2), and a particle diameter of 300 μm or more (Comparative Example 3) were prepared. Each of the Si powders was charged in a carbon mold, which was then placed in a hot press machine. A pressure of 5 MPa was applied starting from the initial state, and sintering was performed in an Ar gas atmosphere at 900° C. for three hours. Then, the pressure was released, and the temperature was cooled to room temperature.

The obtained target materials (Si sintered materials) were machined into a shape having a diameter of 300 mm and a thickness of 5 mm and brazed to a Cu backing plate to produce three types of Si sputtering targets. These Si targets had a relative density of 73% in Comparative Example 1, 82% in Comparative Example 2, and 90% in Comparative Example 3, but the peak intensity ratio ($I_{(111)}/I_{(220)}$) of the sputtering surface was 4.2 in Comparative Example 1, 3.9 in Comparative Example 2, and 3.8 in Comparative Example 3. These Si targets were subjected to the characteristic evaluation described later.

COMPARATIVE EXAMPLES 4 TO 6

Boron-doped Si powders having a purity of 3N and a particle diameter of 150 μm or less (Comparative Example 4), a particle diameter of 150 to 300 μm (Comparative Example 5), and a particle diameter of 300 μm or more (Comparative Example 6) were prepared. Each of the Si powder was charged into a capsule and vacuum-sealed, then the capsule was set in a HIP apparatus. A pressure of 150 MPa was applied from the initial state, and HIP treatment was performed under conditions of 1200° C.×3 hr (Comparative Example 4), 1300° C.×5 hr (Comparative Example 5), and 1250° C.×2.5 hr (Comparative Example 6) in an Ar atmosphere. Then, the pressure was released, and the temperature was cooled to room temperature.

The obtained target materials (Si sintered materials) were machined into a shape having a diameter of 300 mm and a thickness of 5 mm and brazed to a Cu backing plate to produce three types of Si sputtering targets. These Si targets had a relative density of 96.5% in Comparative Example 4, 98% in Comparative Example 5, and 99.5% in Comparative Example 6, but the peak intensity ratio ($I_{(111)}/I_{(220)}$) of the sputtering surface was 4.5 in Comparative Example 4, 3.9 in Comparative Example 5, and 5.5 in Comparative Example 6. These Si targets were subjected to the characteristic evaluation described later.

COMPARATIVE EXAMPLE 7

A polycrystalline Si target formed of a commercially available melting material was prepared. The peak intensity ratio ($I_{(111)}/I_{(220)}$) of sputtering surface of the polycrystalline Si target was 5.5. The Si target was subjected to the characteristic evaluation described later.

Then, the individual Si sputtering targets of the above-described Examples 1 to 6 and Comparative Examples 1 to 7 were used to form Si oxide films ($SiO_x$ films) on an 8-inch glass substrate under conditions of a sputtering method: magnetron sputtering, power DC: 2 kW, a back pressure: $1\times10^{-5}$ Pa, Ar: 5 Pa, $O_2$: 0.5 Pa, and sputtering time: 60 min. Film thickness distribution in the surface of the individual Si oxide films at the time when integral power was 1 kwh, 100 kwh, and 500 kwh in the process of forming the Si oxide films was measured. The obtained results are shown in Table 1. The film thickness distribution in the surface of the individual Si oxide film was obtained by measuring a thickness of the films at an interval of 5 mm from the end of the diameter of the glass substrate, determining a maximum value and a minimum value from the measured values, and calculating based on a formula [{(maximum value−minimum value)/(maximum value+minimum value)}×100(%)] in view of the maximum value and the minimum value.

TABLE 1

| | | | Si target | | Thickness distribution of Si oxide film (%) | | |
|---|---|---|---|---|---|---|---|
| | Sintering method | Si material Powder* (Mass ratio) | Relative density (%) | (111)/(220) Intensity ratio (%) | After 1 kWh | After 100 kWh | After 500 kWh |
| E1 | HP | Fine powder:coarse powder = 70:30 | 75 | 1.5 | 0.38 | 0.41 | 0.40 |
| E2 | HP | Fine powder:coarse powder = 75:25 | 86 | 1.8 | 0.33 | 0.35 | 0.33 |
| E3 | HP | Fine powder:coarse powder = 80:20 | 93 | 2.1 | 0.36 | 0.38 | 0.37 |
| E4 | HIP | Fine powder:coarse powder = 70:30 | 78 | 1.55 | 0.39 | 0.39 | 0.40 |
| E5 | HIP | Fine powder:coarse powder = 75:25 | 88 | 1.82 | 0.31 | 0.31 | 0.32 |
| E6 | HIP | Fine powder:coarse powder = 80:20 | 94 | 2.05 | 0.42 | 0.45 | 0.44 |
| CE1 | HP | Fine powder = 100 | 73 | 4.2 | 4.5 | 4.6 | 4.6 |
| CE2 | HP | 150 to 300 μm = 100 | 82 | 3.9 | 4.3 | 4.3 | 4.2 |
| CE3 | HP | Coarse powder = 100 | 90 | 3.8 | 4.4 | 4.2 | 4.1 |
| CE4 | HIP | Fine powder = 100 | 96.5 | 4.5 | 4.8 | 4.8 | 4.9 |
| CE5 | HIP | 150 to 300 μm = 100 | 98 | 3.9 | 4.1 | 3.8 | 3.8 |
| CE6 | HIP | Coarse powder = 100 | 99.5 | 4.3 | 4.8 | 4.8 | 4.8 |
| CE7 | | Melting material (polycrystalline Si) | 100 | 5.5 | 5.6 | 5.3 | 5.5 |

E = Example;
CE = Comparative Example
*Fine powder = particle diameter of 150 μm or less, coarse powder = particle diameter of 300 μm or more As apparent from Table 1, it is seen that the individual Si sputtering targets of Examples 1 to 6 have a small dispersion in film thickness distribution in the film surface of the Si oxide film. It is also seen that the Si oxide film which is excellent in uniformity of the film thickness distribution can be obtained stably from the start of the film formation to about the life end. Meanwhile, in a case where the Si sputtering targets according to Comparative Examples 1 to 7 are used, the Si oxide films obtained have a large dispersion in the film thickness distribution in the film surface.

EXAMPLES 7 TO 12

Boron-doped Si powder having a purity of 3N and a particle diameter of 75 to 100 μm was prepared. The Si powder was charged into a carbon mold, which was then placed in a hot press (HP) machine. Sintering was performed in vacuum of $1 \times 10^{-3}$ Pa at 800° C. (Example 7), 900° C. (Example 8), 1000° C. (Example 9), 1100° C. (Example 10), 1200° C. (Example 11), and 1300° C. (Example 12) for five hours. The pressure for sintering was 25 MPa.

The obtained target materials (Si sintered materials) were machined into a shape having a diameter of 50 mm and a thickness of 5 mm and brazed to a Cu backing plate to produce six types of Si sputtering targets. These Si targets were measured for Vickers hardness and its dispersion according to the above-described method. The measured results are shown in Table 2. These Si targets were subjected to the characteristic evaluation described later.

EXAMPLE 13

Boron-doped Si powder having a purity of 3N and a particle diameter of 200 μm or less was prepared. The Si powder was charged into a carbon mold, which was then placed in a hot press (HP) machine. And, sintering was performed in vacuum of $1 \times 10^{-3}$ Pa at 1300° C. for five hours. The pressure for sintering was 25 MPa. The obtained target material (Si sintered material) was machined into a shape having a diameter of 50 mm and a thickness of 5 mm and brazed to a Cu backing plate to produce an Si sputtering target. Vickers hardness and its dispersion of the Si target are shown in Table 2. The Si target was subjected to the characteristic evaluation described later.

EXAMPLES 14 TO 16

Boron-doped Si powder having a purity of 3N and a particle diameter of 75 to 100 μm was charged into a capsule and vacuum-sealed, then the capsule was set in a HIP apparatus. HIP treatment (sintering) was performed under conditions of 1100° C. (Example 14), 1200° C. (Example 15), and 1300° C. (Example 16) in an Ar atmosphere. A pressure for the HIP treatment was 100 MPa. The obtained target materials (Si sintered materials) were machined into a shape having a diameter of 50 mm and a thickness of 5 mm and brazed to a Cu backing plate to produce three types of Si sputtering targets. Vickers hardness and its dispersion of the Si targets are shown in Table 2. The Si targets were subjected to the characteristic evaluation described later.

EXAMPLES 17 TO 19

Boron-doped Si powder having a purity of 3N and a particle diameter of 200 μm or less was charged into a capsule and vacuum-sealed, then the capsule was set in a HIP apparatus. HIP treatment (Sintering) was performed under conditions of 1100° C. (Example 17), 1200° C. (Example 18), and 1300° C. (Example 19) in an Ar atmosphere. A pressure for the HIP treatment was 100 MPa. The obtained target materials (Si sintered materials) were machined into a shape having a diameter of 50 mm and a thickness of 5 mm and brazed to a Cu backing plate to produce three types of Si sputtering targets. Vickers hardness and its dispersion of the Si targets are shown in Table 2. The Si targets were subjected to the characteristic evaluation described later.

COMPARATIVE EXAMPLES 8 AND 9

Boron-doped Si powder having a purity of 3N and a particle diameter of 75 to 100 μm was charged into a carbon mold, which was then set in a hot press (HP) apparatus. Sintering was performed under conditions of 1100° C. (Example 17), 1200° C. (Example 18), and 1300° C. (Example 19) in an Ar atmosphere. And, sintering was performed in vacuum of $1 \times 10^{-3}$ Pa at 500° C. (Comparative Example 8), and 700° C. (Comparative Example 9) for five hours. The pressure for sintering was 25 MPa. The obtained target materials (Si sintered materials) were machined into a target shape, but the obtained targets could not be used in practice because they were cracked during the fabrication.

COMPARATIVE EXAMPLES 10 AND 11

A polycrystalline Si target (Comparative Example 10) and a monocrystalline Si target (Comparative Example 11) which were formed of a commercially available melting material were prepared. For the Vickers hardness of these targets of the melting material, the polycrystalline Si target (Comparative Example 10) had Hv 1109, and the monocrystalline Si target (Comparative Example 11) had Hv 907. The Si targets were subjected to the characteristic evaluation described later.

Then, the individual Si sputtering targets of the above-described Examples 7 to 19 and Comparative Examples 10 and 11 were used to form an Si oxide film ($SiO_x$ film) on a glass substrate under conditions of a sputtering method: magnetron sputtering, power DC: 1 kW, a sputter pressure: 5 Pa, Ar: 50 sccm, and $O_2$: 10 sccm. The film formation step of the Si oxide film was conducted continuously, and erosion depth was measured at the time when the Si target was cracked. The obtained results are shown in Table 2.

TABLE 2

| | Production conditions | | | Si target Vickers hardness | | |
|---|---|---|---|---|---|---|
| | Sintering method | Particle diameter of Si material powder (μm) | Sintering temperature | Average value (Hv) | Dispersion (%) | Max erosion depth (μm) |
| E7 | HP | 75 to 100 | 800 | 342 | 16 | 2.4 |
| E8 | HP | 75 to 100 | 900 | 409 | 15 | 2.5 |
| E9 | HP | 75 to 100 | 1000 | 498 | 13 | 2.6 |
| E10 | HP | 75 to 100 | 1100 | 522 | 11 | 2.7 |

TABLE 2-continued

|  | Production conditions | | | Si target Vickers hardness | | |
|---|---|---|---|---|---|---|
|  | Sintering method | Particle diameter of Si material powder (μm) | Sintering temperature | Average value (Hv) | Dispersion (%) | Max erosion depth (μm) |
| E11 | HP | 75 to 100 | 1200 | 572 | 10 | 2.6 |
| E12 | HP | 75 to 100 | 1300 | 602 | 7 | 2.2 |
| E13 | HP | 200 or less | 1300 | 580 | 34 | 1.7 |
| E14 | HIP | 75 to 100 | 1100 | 591 | 9 | 2.7 |
| E15 | HIP | 75 to 100 | 1200 | 613 | 8 | 2.3 |
| E16 | HIP | 75 to 100 | 1300 | 730 | 7 | 2.2 |
| E17 | HIP | 200 or less | 1100 | 578 | 36 | 1.8 |
| E18 | HIP | 200 or less | 1200 | 602 | 34 | 1.5 |
| E19 | HIP | 200 or less | 1300 | 708 | 34 | 1.6 |
| CE8 | HP | 75 to 100 | 500 | 152 | 13 | —* |
| CE9 | HP | 75 to 100 | 700 | 234 | 10 | —* |
| CE10 | Melting material (polycrystalline Si) | | | 1109 | 39 | 0.9 |
| CE11 | Melting material (monocrystalline Si) | | | 907 | 10 | 1.1 |

E = Example;
CE = Comparative Example
*Cracked when fabricating

It is apparent from Table 2 that the individual Si sputtering targets of Comparative Examples 10 and 11 had a crack in a relatively early stage (erosion depth was small). On the other hand, it is seen from the erosion depth that a frequency of use of the individual Si sputtering targets of Examples 7 to 19 is enhanced. Especially, it is seen that the Si sputtering targets (Examples 7 to 12 and Examples 14 to 16) having Vickers hardness in a range of Hv 300 to 800 and Vickers hardness with a dispersion within 30% have a deep erosion depth at the occurrence of a crack, and a long life has been achieved. The individual Si sputtering targets of Examples 7 to 19 are formed of the Si sintered material having a relative density in a range of 70 to 95%.

EXAMPLE 20

Si powder (a purity of 4N) having a particle diameter in a range of 75 to 100 μm was prepared and charged into a carbon mold. At that time, the carbon mold was vibrated to enhance the charging density of the Si powder and to homogenize the charging density. The carbon mold was placed in a hot press (HP) apparatus, and sintering was performed in a vacuum atmosphere of $1\times10^{-3}$ Pa at 900° C. for five hours while applying a pressure of 25 MPa. Then, the pressure was released, and the temperature was cooled to room temperature.

The obtained target material (Si sintered material) was machined into a shape having a diameter of 50 mm and a thickness of 5 mm and brazed to a Cu backing plate to produce an Si sputtering target. Relative density and its dispersion of the Si target were measured according to the above-described method to find that the relative density was 72% and its dispersion was 12%. The Si target was subjected to the characteristic evaluation described later.

EXAMPLES 21 TO 25

Target materials (Si sintered materials) were produced in the same way as in the above-described Example 20 except that the sintering conditions (a sintering method, a sintering temperature, and a sintering time) were changed to the conditions shown in Table 3. Using these target materials (Si sintered materials), the Si sputtering targets were produced in the same way as in Example 20. Relative density and its dispersion of each of the Si sputtering targets are shown in Table 3. The individual Si sputtering targets were subjected to the characteristic evaluation described later.

COMPARATIVE EXAMPLES 12 TO 15

Target materials (Si sintered materials) were produced in the same way as in the above-described Example 20 except that a particle diameter of Si powder and sintering conditions (a sintering method, a sintering temperature, and a sintering time) were changed to the conditions shown in Table 3. Using these target materials (Si sintered materials), the Si sputtering targets were produced in the same way as in Example 20. Relative density and its dispersion of each of the Si sputtering targets are shown in Table 3. The individual Si sputtering targets were subjected to the characteristic evaluation described later.

Then, the individual Si sputtering targets of the above-described Examples 20 to 25 and Comparative Examples 10 and 11 (commercially available polycrystalline Si target and monocrystalline Si target) and Comparative Examples 12 to 15 were used to form Si oxide films ($SiO_x$ films) by sputter film formation under the following conditions. DC sputtering was applied for the sputter film formation, and the sputtering conditions were a sputtering gas of Ar=50 sccm+$O_2$=10 sccm, a sputtering pressure of 5 Pa, power of 100 W, and sputter time of 600 sec. Each Si oxide film ($SiO_x$ film) was formed on a glass substrate under the above conditions. Each Si oxide film was measured for thickness by a difference meter, and the measured thickness was divided by a film formation time (600 sec) to determine a film forming speed (nm/min). The obtained results are shown in Table 3.

TABLE 3

| | | Production conditions of Si target | | | | Target density | | Film |
|---|---|---|---|---|---|---|---|---|
| | | | Powder | | | | | |
| | | Production method | particle diameter (μm) | Sintering temp. (° C.) | Sintering time (hr) | Relative density (%) | Dispersion (%) | forming rate (nm/min) |
| E | 20 | HP | 75 to 100 | 900 | 5 | 72 | 12 | 25 |
| | 21 | HP | 75 to 100 | 1000 | 5 | 76 | 6 | 23 |
| | 22 | HP | 75 to 100 | 1100 | 5 | 81 | 4 | 22 |
| | 23 | HP | 75 to 100 | 1200 | 5 | 84 | 2 | 21 |
| | 24 | HP | 75 to 100 | 1300 | 5 | 83 | 5 | 19 |
| | 25 | HIP | 75 to 100 | 1100 | 5 | 85 | 3 | 30 |
| CE | 10 | Melting material (polycrystalline Si) | | | | 100 | 2 | 10 |
| | 11 | Melting material (monocrystalline Si) | | | | 100 | 1 | 14 |
| | 12 | HP | 75 to 100 | 500 | 5 | 43 | 13 | (Cracked) |
| | 13 | HP | 75 to 100 | 700 | 5 | 48 | 12 | (Cracked) |
| | 14 | HP | 75 to 100 | 800 | 1 | 53 | 34 | (Cracked) |
| | 15 | HIP | <100 | 1300 | 5 | 99 | 32 | 13 |

E = Example;
CE = Comparative Example

EXAMPLES 26 AND 27

A target material (Si sintered material) was produced in the same way as in Example 20 except that the particle diameter of the Si powder was changed to the conditions shown in Table 4. Using these target materials (Si sintered materials), the Si sputtering targets were produced in the same way as in Example 20. Oxygen contents of the Si sputtering targets and their dispersions were measured according to the above-described method. The measured results are shown in Table 4. The individual Si sputtering targets had relative densities of 72% and 76%. The individual Si sputtering targets were subjected to the characteristic evaluation described later.

EXAMPLES 28 TO 30

Each Si powder having the particle diameter shown in Table 4 was charged into a carbon mold and undergone a calcining step in a vacuum atmosphere under the conditions shown in Table 4. Then, sintering (HP sintering) was performed while applying a pressure of 25 MPa under conditions of 800 to 1200° C. for five hours. Then, the applied pressure was removed, and cooling to room temperature was conducted. The obtained individual target materials (Si sintered materials) were used to produce Si sputtering targets in the same way as in Example 20. These Si sputtering targets were measured for their oxygen content and dispersion thereof according to the above-described method. The obtained results are shown in Table 4. The individual Si sputtering targets were subjected to the characteristic evaluation described later.

COMPARATIVE EXAMPLES 16 TO 20

Target materials (Si sintered materials) were produced in the same way as in Example 28 except that the particle diameter of the Si powder and the calcining conditions (calcining temperature, and calcining time) were changed to the conditions shown in Table 4. Using these target materials (Si sintered materials), the Si sputtering targets were produced in the same way as in Example 20. Oxygen contents of the Si sputtering targets and their dispersions are shown in Table 4. The individual Si sputtering targets were subjected to the characteristic evaluation described later.

Then, using the individual Si sputtering targets of the above-described Examples 26 to 30, Comparative Examples 10 and 11, and Comparative Examples 16 to 20, each Si oxide film ($SiO_x$ film) was formed on a glass substrate under the same conditions as in Example 20. The film forming speed of the Si oxide film was measured and evaluated in the same way as in Example 20. The results are also shown in Table 4.

TABLE 4

| | | Production conditions of Si target | | | | Oxygen content | | Film |
|---|---|---|---|---|---|---|---|---|
| | | | Powder | | | | state | |
| | | Production method | particle diameter (μm) | Calcining temp. (° C.) | Calcining time (hr) | Oxygen content (Mass %) | Dispersion (%) | forming rate (nm/min) |
| E | 26 | HP | 75 to 100 | None | — | 0.03 | 6 | 18 |
| | 27 | HP | 45 to 75 | None | — | 0.06 | 5 | 19 |
| | 28 | HP | 150 to 200 | 500 | 5 | 0.39 | 13 | 23 |
| | 29 | HP | 75 to 150 | 500 | 5 | 0.42 | 4 | 24 |
| | 30 | HP | 45 to 75 | 500 | 5 | 0.42 | 3 | 24 |
| CE | 10 | Melting material (polycrystalline Si) | | | | <0.001 | 2 | 10 |
| | 11 | Melting material (monocrystalline Si) | | | | <0.001 | 2 | 14 |
| | 16 | HP | <150 | 700 | 1 | 1.65 | 34 | (AED) |
| | 17 | HP | <75 | 700 | 1 | 2.03 | 37 | (AED) |

TABLE 4-continued

| | Production conditions of Si target | | | | Oxygen content | | Film |
| | | Powder | | | | state | |
| | Production method | particle diameter (μm) | Calcining temp. (°C.) | Calcining time (hr) | Oxygen content (Mass %) | Dispersion (%) | forming rate (nm/min) |
|---|---|---|---|---|---|---|---|
| 18 | HP | <45 | 700 | 1 | 2.42 | 39 | (AED) |
| 19 | HP | 75 to 100 | 700 | 5 | 1.87 | 14 | (AED) |
| 20 | HP | 45 to 75 | 700 | 5 | 2.07 | 13 | (AED) |

E = Example;
CE = Comparative Example;
(AED) = (Abnormal electrical discharge)

It is apparent from Table 4 that the film forming speeds of the Si oxide films are improved because the individual Si sputtering targets of Examples 26 to 30 are controlled their oxygen content.

INDUSTRIAL APPLICABILITY

The sputtering targets of the present invention are controlled the configuration of the crystal orientation of the sputtering surface, relative density, hardness, oxygen content and the like, so that the improvement of the film thickness characteristics of the formed films, the decrease of the film formation cost and the defect occurrence rate and the like can be made. The use of the sputtering targets reduces the film formation cost and the defect occurrence rate and enables to obtain the Si oxide films, which have the film thickness distribution, film characteristics and the like uniformized, with good reproducibility. These effects contribute highly to, for example, the cost reduction, improvement of characteristics and the like of the optical thin film.

What is claimed is:

1. A sputtering target consisting essentially of Si,
   wherein the target comprises Si sintered material having a relative density in a range of 70% or more and 95% or less, and
   wherein a ratio $(I_{(111)}/I_{(220)})$ of peak intensity $(I_{(111)})$ of (111) face to peak intensity $(I_{(220)})$ of (220) face of Si is in a range of 1.8±0.3 when a sputtering surface of the target is measured for crystal face orientation by X-ray diffractometry.

2. The sputtering target according to claim 1, having hardness in a range of Hv 300 or more and Hv 800 or less in terms of Vickers hardness.

3. The sputtering target according to claim 1, which is a target for forming an oxide film.

4. The sputtering target according to claim 1, which is used as a target for forming an optical thin film.

5. A process for producing an Si oxide film, comprising forming an Si oxide film by sputtering the sputtering target according to claim 1 in an oxygen-containing atmosphere.

6. The process for producing an Si oxide film according to claim 5, wherein the Si oxide film is an optical thin film.

7. The sputtering target according to claim 1, wherein the sputtering target has a sintered structure.

* * * * *